United States Patent [19]

Kimura

US005309396A

[11] Patent Number: 5,309,396
[45] Date of Patent: May 3, 1994

[54] INPUT BUFFER CIRCUIT, INPUT/OUTPUT BUFFER CIRCUIT AND PORTABLE SEMICONDUCTOR MEMORY DEVICE WITH BACK-UP POWER

[75] Inventor: Masatoshi Kimura, Itami, Japan

[73] Assignee: Mitsubishi Denki Kabushiki Kaisha, Tokyo, Japan

[21] Appl. No.: 791,334

[22] Filed: Nov. 14, 1991

[30] Foreign Application Priority Data

Nov. 30, 1990 [JP] Japan ................... 2-330480

[51] Int. Cl.⁵ .................. G11C 14/00; H03K 3/01
[52] U.S. Cl. .................. 365/189.05; 365/228; 365/229
[58] Field of Search ............ 365/228, 229, 189.05

[56] References Cited

U.S. PATENT DOCUMENTS

| | | | |
|---|---|---|---|
| 4,730,121 | 3/1988 | Lee et al. | 365/229 |
| 5,016,223 | 5/1991 | Kimura et al. | 365/229 |
| 5,101,119 | 3/1992 | Yoshimori et al. | 365/228 |
| 5,168,206 | 12/1992 | Jones | 365/229 |
| 5,197,026 | 3/1993 | Butler | 365/228 |
| 5,212,664 | 5/1993 | Shinohara | 365/228 |

FOREIGN PATENT DOCUMENTS

| | | |
|---|---|---|
| 0391603 | 10/1990 | European Pat. Off. . |
| 1368686 | 10/1974 | United Kingdom . |
| 1554013 | 10/1979 | United Kingdom . |
| 2082415 | 3/1982 | United Kingdom . |

Primary Examiner—Eugene R. LaRoche
Assistant Examiner—Son Dinh
Attorney, Agent, or Firm—Leydig, Voit & Mayer

[57] ABSTRACT

An input buffer circuit includes at least one unidirectional buffer, a first power supply line for supplying power to the buffer, a power cutoff circuit connected between the buffer and the first power supply line for connecting the first power supply line to the buffer when a predetermined voltage level is supplied to the first power supply line, and for disconnecting the first power supply line from the buffer when the predetermined voltage level is not supplied to the first power supply line, an impedance lowering circuit for lowering impedance of an input bus when the predetermined level of power is not supplied to the first power supply line, and a second power supply line for supplying power to the impedance lowering circuit. Insertion of the input buffer circuit in the input bus of a semiconductor memory suppresses the current consumed by the memory and improves the reliability of the memory.

23 Claims, 6 Drawing Sheets

TO OTHER PORTS

INPUT BUFFER CIRCUIT, INPUT/OUTPUT BUFFER CIRCUIT AND PORTABLE SEMICONDUCTOR MEMORY DEVICE WITH BACK-UP POWER

BACKGROUND OF THE INVENTION

1. Field of the Invention

This invention relates to an input buffer circuit and an input/output buffer circuit for a semiconductor memory, and also to a portable semiconductor storage such as a memory card or memory pack.

2. Description of the Related Art

FIG. 9 shows a conventional portable semiconductor storage. This storage has a static RAM 1 and a nonvolatile memory 4. The storage is connected to a terminal unit not shown. When power is supplied from the terminal unit to an external input power line 13 and the voltage of the external input power line 13 exceeds a predetermined threshold, a power control circuit 6 makes the external input power line 13 conducted to an internal power line 14 and simultaneously delivers a back-up signal of "H" level to a decoder 70 for enabling the decoder 70. Under this condition, the terminal unit can perform read/write operations of the static RAM 1 or the nonvolatile memory 4 via an address bus 16, an output enable signal line 17, a write enable signal line 18, a chip select signal line 19 and a data bus 20. Selection between the static RAM 1 and the nonvolatile memory 4 is made via the decoder 70 using a chip select address signal line 12 branched from the address bus 16. The decoder 70 generally comprises a commercially available address decoder such as Model HC 138P.

Meanwhile, in a standby mode where no power is supplied from the terminal unit, the voltage of the external input power line 13 cannot reach the predetermined threshold, thereby bringing the power control circuit 6 into a turned-off state. In this state, power is supplied to the internal power line 14 via a reverse current blocking diode 27 and a current limiting resistor 28 from a battery 29 built in the storage. Accordingly, the stored data in the static RAM 1 is held as it is. At this time, a back-up signal of "L" level is delivered from the power control circuit 6 to the decoder 70. The decoder 70 is thereby disabled so that an internal chip enable signal line 24 and a nonvolatile memory chip select signal line 26 are both turned to a "H" level for inhibiting an access to the static RAM 1 and the nonvolatile memory 4. Note that the stored data in the nonvolatile memory 4 remains the same regardless of a level of the chip select signal line 26.

In the conventional storage, as shown in FIG. 9, since a power input of the nonvolatile memory 4 is connected to the internal power line 14 as with the static RAM 1, the power consumed by the nonvolatile memory 4 is supplied from the battery 29 via the internal power line 14 in a standby mode where no power is supplied from the terminal unit to the external input power line 13.

Generally, the current consumed by the nonvolatile memory 4 is larger by about one to two orders of magnitude than the current consumed by the static RAM 1. The life time of the battery 29 is therefore substantially determined by the current consumed by the nonvolatile memory 4. This results in a problem that the data holding time of the static RAM 1 is extremely shortened.

Furthermore, if the power input of the nonvolatile memory 4 is connected to the external input power line 13 for the prolonged life time of the battery 29, the following problem would arise. More specifically, the nonvolatile memory chip select signal line 26 is held at a "H" in the standby mode, causing a current to flow out into the external input power line 13 via an input side diode 4a of the nonvolatile memory 4 as shown in FIG. 10. Consequently, the current consumed by the chip select signal line 26 would be increased to an abnormal extent. As a result, the normal operation of the decoder 70 will not be guaranteed, resulting in a fear that the life time of the battery 29 may be cut down, or the stored data in the static RAM 1 may be disappeared.

In addition, because of the static RAM 1 being directly connected to the exterior, inputs and outputs of the static RAM 1 are under a floating state. This leads to another fear that external noise is so likely to superpose that data may be changed, or the static RAM 1 may be deteriorated or destroyed.

SUMMARY OF THE INVENTION

This invention has been achieved to solve the problems as mentioned above, and its object is to provide an input buffer circuit which is inserted in an input bus of a memory and which can suppress the current consumed by the memory and improving reliability of the memory.

Another object of this invention is to provide an input/output buffer circuit which is inserted in an input-/output bus of a memory and which can suppress the current consumed by the memory and improving reliability of the memory.

A further object of this invention is to provide a portable semiconductor storage which requires a small consumption current in a standby mode and has superior reliability.

An input buffer circuit according to a first invention comprises at least one unidirectional buffer, a first power supply line for supplying power to said buffer, a power cutoff circuit provided between said buffer and said first power supply line for connecting said first power supply line to said buffer when a predetermined level of power is supplied to said first power supply line, and for disconnecting said first power supply line from said buffer when the predetermined level of power is not supplied to said first power supply line, an impedance lowering circuit for lowering impedance of an input bus when the predetermined level of power is not supplied to said first power supply line, and a second power supply line for supplying power to said impedance lowering circuit.

An input/output buffer circuit according to a second invention comprises at least one bidirectional buffer, a first power supply line for supplying power to said buffer, a power cutoff circuit provided between said buffer and said first power supply line for connecting said first power supply line to said buffer when a predetermined level of power is supplied to said first power supply line, and for disconnecting said first power supply line from said buffer when the predetermined level of power is not supplied to said first power supply line, an impedance lowering circuit for lowering impedance of an input/output bus when the predetermined level of power is not supplied to said first power supply line, and a second power supply line for supplying power to said impedance lowering circuit.

A portable semiconductor storage according to a third invention comprises a semiconductor memory, an internal power line connected to said semiconductor} memory, an external input power line, a power control circuit for connecting said external input power line to said internal power line only when voltage of said external input power line exceeds a predetermined threshold, an input buffer circuit coupled to an input bus for said semiconductor memory, an input/output buffer circuit coupled to an input/output bus for said semiconductor memory, power cutoff means for connecting said input buffer circuit and said input/output buffer circuit to said external input power line when the voltage of said external input power line exceeds said threshold, and for disconnecting said input buffer circuit and said input/output buffer circuit from said external input power line when the voltage of said external input power line is below said threshold, and impedance lowering means for lowering impedances of the input bus and the input/output bus of said semiconductor memory when the voltage of said external input power line is below said threshold.

In the input buffer circuit of the present invention, when the predetermined level of power is not supplied to the first power supply line, the power cutoff circuit disconnects the first power supply line from the unidirectional buffer, and the impedance lowering circuit lowers the impedance of the input bus for the semiconductor memory.

In the input/output buffer circuit of the present invention, when the predetermined level of power is not supplied to the first power supply line, the power cutoff circuit disconnects the first power supply line from the bidirectional buffer, and the impedance lowering circuit lowers the impedance of the input/output bus for the semiconductor memory.

In the portable semiconductor storage of the present invention, when the voltage of the external input power line is below the predetermined threshold, the power cutoff means disconnects the input buffer circuit and the input/output buffer circuit from the external input power line, and the impedance lowering means lowers the impedances of the input bus and the input/output bus for the semiconductor memory.

DESCRIPTION OF THE PREFERRED EMBODIMENTS

Hereinafter, embodiments of this invention will be described with reference to the attached drawings.

Figure 1:
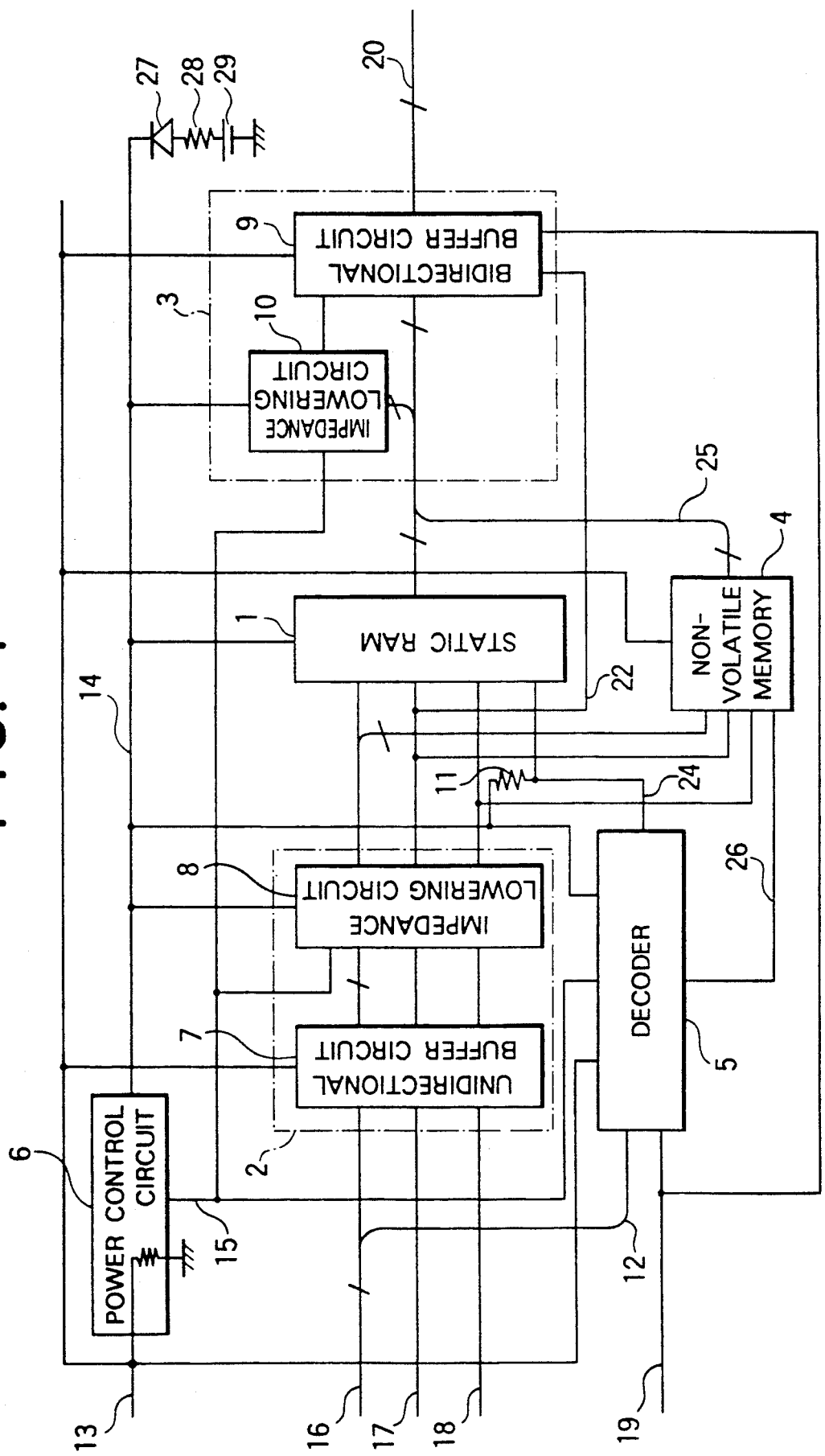
FIG. 1 is a block diagram showing a portable semiconductor storage according to one embodiment of this invention.

In FIG. 1, a portable semiconductor storage according to one embodiment of this invention has an external input power line 13 and an internal power line 14 connected to the external input power line 13 via a power control circuit 6. A static RAM 1 is connected to the internal power line 14 and a nonvolatile memory 4 to the external input power line 13. Connected to the static RAM 1 and the nonvolatile memory 4 are an input bus comprising an address bus 16, an output enable signal line 17 and a write enable signal line 18 via an input buffer circuit 2, as well as a data bus 20 as an input/output bus via an input/output buffer circuit 3. The input buffer circuit 2 comprises a unidirectional buffer circuit 7 connected to the external input power line 13 and an impedance lowering circuit 8 connected to the internal power line 14. The input/output buffer circuit 3 comprises a bidirectional buffer circuit 9 connected to the external input power line 13 and an impedance lowering circuit 10 connected to the internal power line 14.

A decoder 5 is connected to a chip select address signal line 12 branched from the address bus 16, and a chip select signal line 19 to the decoder 5. The decoder 5 is connected to each of the static RAM 1 and the nonvolatile memory 4 via an internal chip enable signal line 24 and a nonvolatile memory chip select signal line 26, respectively.

An internal output enable signal line 22, coupling the input buffer circuit 2 to the static RAM 1 and the nonvolatile memory 4, and a chip selector signal line 19 are both connected to the bidirectional buffer circuit 9 of the input/output buffer circuit 3.

A back-up signal line 15 is connected from the power control circuit 6 to the impedance lowering circuit 8 of the input buffer circuit 2, the impedance lowering circuit 10 of the input/output buffer circuit 3, and the decoder 5. Also, a battery 29 is connected to the internal power line 14 via a reverse current blocking diode 27 and a current limiting resistor 28.

Figure 2:
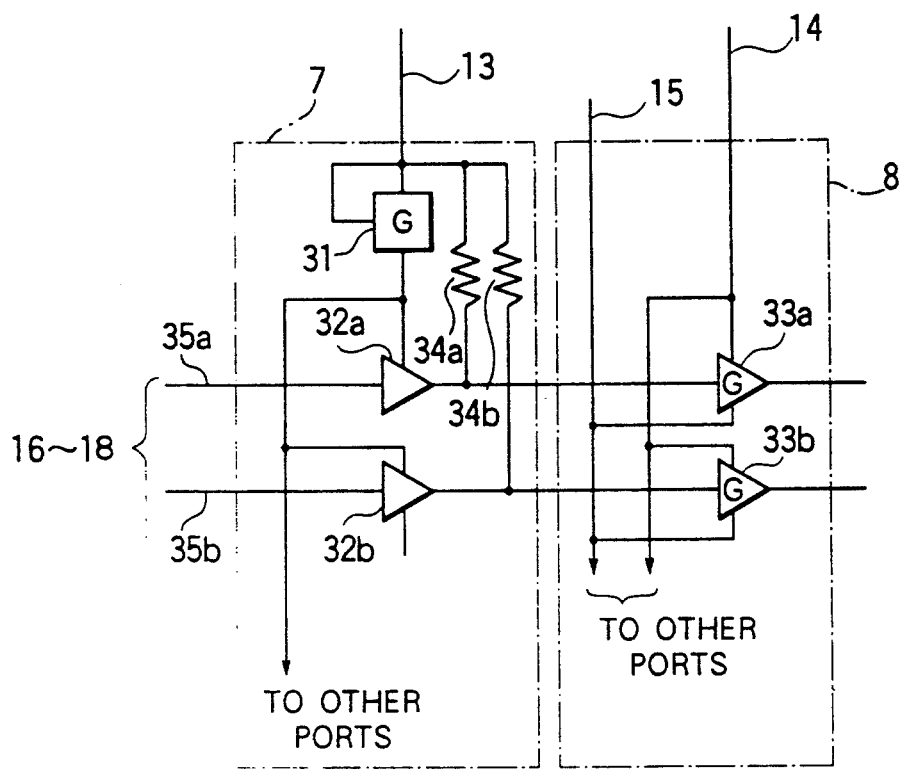
FIG. 2 is a circuit diagram showing an input buffer circuit used in the storage of FIG. 1.

Next, the internal structure of the input buffer circuit 2 is shown in FIG. 2. In the unidirectional buffer circuit 7, a plurality of unidirectional buffers 32a and 32b, etc. are respectively connected to corresponding ports 35a and 35b, etc. which are in turn connected to the address bus 16, the output enable signal line 17 and the write enable signal line 18 jointly constituting the input bus. The external input power line 13 as a first power supply line is connected to the unidirectional buffers 32a and 32b via a power cutoff circuit 31. The external input power line 13 is also connected to a gate terminal of the power cutoff circuit 31. When a predetermined level of voltage is applied to the external input power line 13, the power cutoff circuit 31 is conducted to supply the power to the unidirectional buffers 32a and 32b. On the other hand, when no voltage is applied to the external input power line 13, the power cutoff circuit 31 is brought into a turned-off state so that impedance of the unidirectional buffer circuit 7 takes a very large value as viewed from the input bus. Incidentally, 34a and 34b denote pull-up resistors connected to the external input power line 13.

In the impedance lowering circuit 8, there are provided a plurality of 3state unidirectional buffers 33a and 33b, etc. respectively connected to outputs of the corresponding unidirectional buffers 32a and 32b, etc. in the unidirectional buffer circuit 7. The internal power line 14 as a second power supply line is connected to the buffers 33a and 33b, while a back-up signal line 15 is connected from the power control circuit 6 to respective gate terminals of the buffers 33a and 33b.

Although only the two ports 35a and 35b are shown in FIG. 2 for brevity of explanation, the ports in the same number as the number of signal lines making up the input bus are configured likewise.

Figure 3:
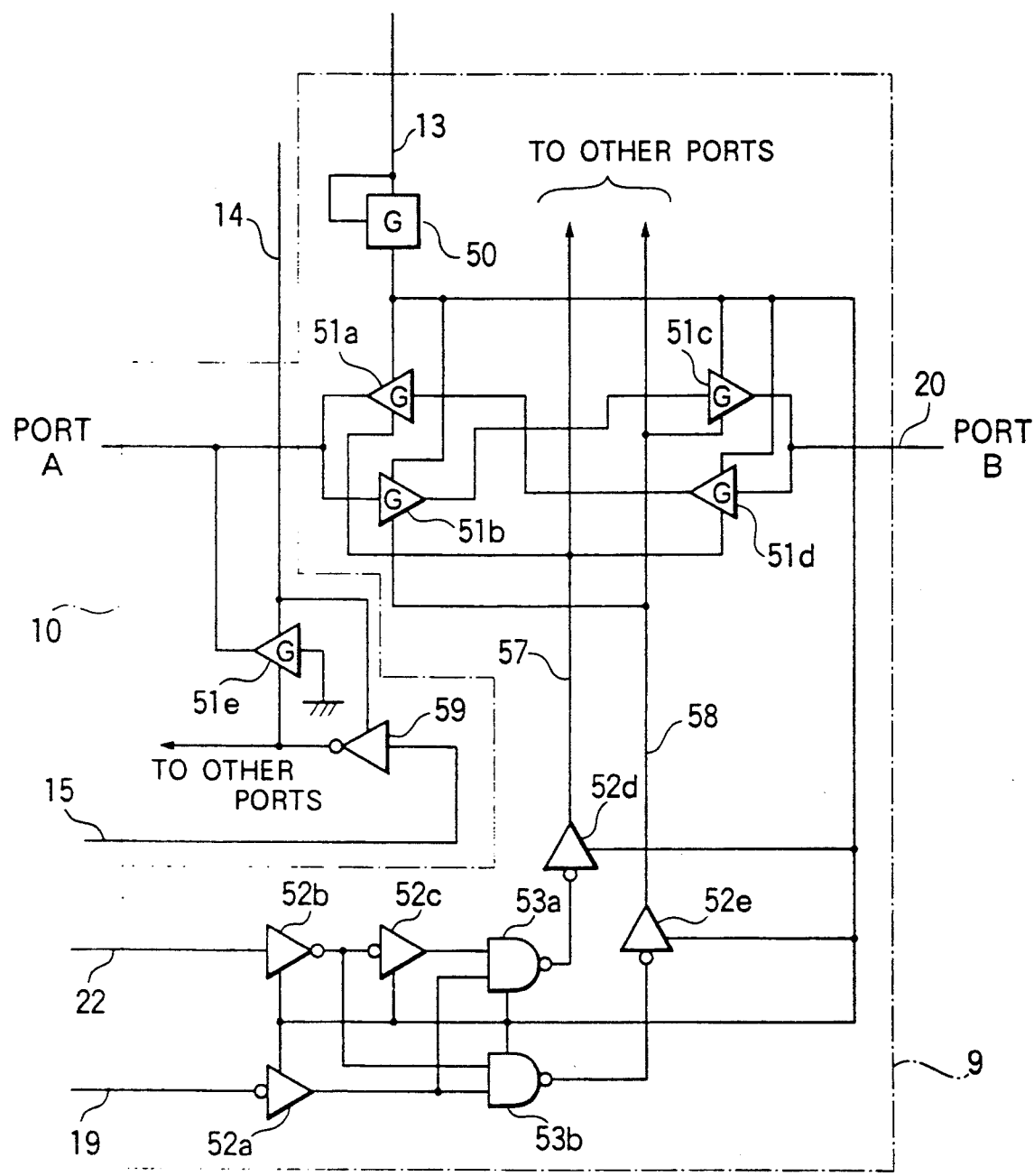
FIG. 3 is a circuit diagram showing an input/output buffer circuit used in the storage of FIG. 1.

FIG. 3 shows the internal structure of the input/output buffer circuit 3. In the bidirectional buffer circuit 9, inverters 52a and 52b are respectively connected to the chip select signal line 19 and the internal output enable signal line 22, the latter being also connected between the input buffer circuit 2 and the static RAM 1. Further, an inverter 52c is connected to the inverter 52b, a NAND circuit 53a to the inverters 52a and 52c, and a NAND circuit 53b to the inverters 52a and 52b. Bus control signal lines 57 and 58 are respectively connected to the NAND circuits 53a and 53b via the inverters 52d and 52e.

3-State non-inverters 51a and 51d are connected to the bus control signal line 57, and 3-state non-inverters 51b and 51c are connected to the bus control signal line 58. These 3-state non-inverters 51a through 51d jointly make up a singal bidirectional buffer having a pair of ports A and B, the buffer being inserted in one signal line of the data bus 20. Although other plural bidirectional buffers are also connected to the bus control signal lines 57 and 58 and inserted in respective signal lines of the data bus 20 via pairs of ports like A and B, they are omitted in FIG. 3 for brevity of explanation.

The external input power line 13 as a first power supply line is connected to respective elements of the 3-state non-inverters 51a through 51d, inverters 52a through 52e, and the NAND circuits 53a and 53b via a power cutoff circuit 50. As with the power cutoff circuit 31 of the input buffer circuit 2, when a predetermined level of voltage is applied to the external input power line 13, the power cutoff circuit 50 is conducted to supply the power to all the elements.

In the impedance lowering circuit 10, there is provided a 3-state non-inverter 51e connected to the port A. Also, an output of a 3-state inverter 59 connected to the back-up signal line 15 from the power control circuit 6 is connected to a gate terminal of the 3-state non-inverter 51e. Through the internal power line 14 as a second power supply line, the power is supplied to the 3-state non-inverter 51e and 3-state inverter 59. Note that, as with the 3-state non-inverters 51e connected to the port A, other 3-state non-inverters are respectively connected to a plurality of ports.

Figure 4:
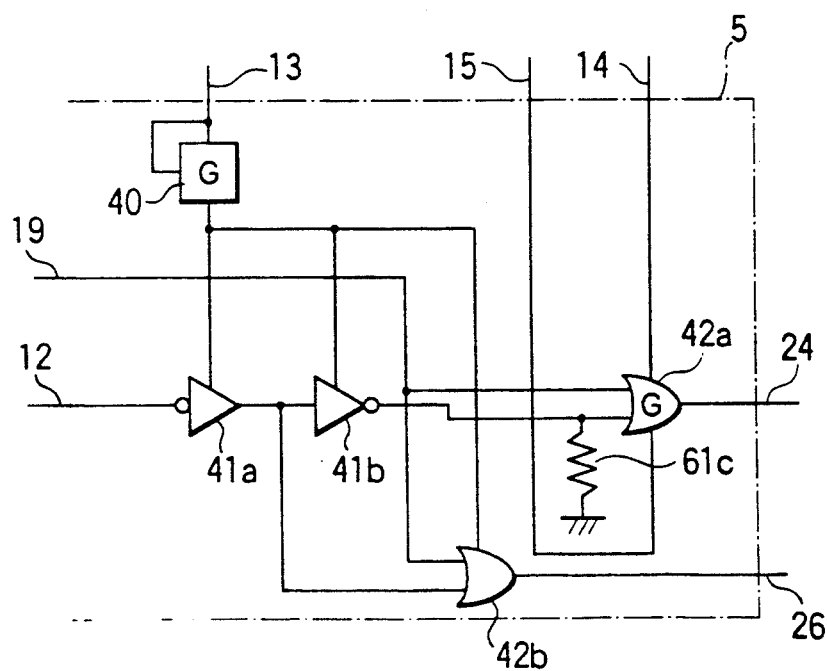
FIG. 4 is a circuit diagram showing a decoder used in the storage of FIG. 1.

FIG. 4 shows the internal structure of the decoder 5. The decoder 5 has inverters 41a and 41b successively connected in series to the chip select address signal line 12 branched from the address bus 16. An output of the inverter 41b and the chip select signal line 19 are connected to the internal chip enable signal line 24 via an OR circuit 42a, while an output of the inverter 41a and the chip select signal line 19 are connected to the nonvolatile memory chip select signal line 26 via an OR circuit 42b.

Connected to the inverters 41a, 41b and the OR circuit 42b is the external input power line 13 via a power cutoff circuit 40. Similarly to the power cutoff circuit 31 of the input buffer circuit 2 and the power cutoff circuit 50 of the input/output buffer circuit 3, when a predetermined level of voltage is applied to the external input power line 13, the power cutoff circuit 40 is conducted to supply the power to the inverters 41a, 41b and the OR circuit 42b. Further, the internal power line 14 is connected to the OR circuit 42a and the back-up signal line 15 from the power control circuit 6 is connected to a gate terminal of the OR circuit 42a. Incidentally, 61c denotes a pull-up resistor.

The power cutoff circuit 31 of the input buffer circuit 2 and the power cutoff circuit 50 of the input/output buffer circuit 3 are part of a power cutoff means, while the impedance lowering circuit 8 of the input buffer circuit 2 and the impedance lowering circuit 10 of the input/output buffer circuit 3 are part of an impedance lowering means.

Analog switches, for example, are used as the power cutoff circuits 31, 40 and 50.

Operation of this embodiment will now be described. First, after connection of the storage shown in FIG. 1 to a terminal unit not shown, when power is supplied from the terminal unit to the external input power line 13 and the voltage of the external input power line 13 exceeds a predetermined threshold, the power control circuit 6 makes the external input power line 13 connected to the internal power line 14 and simultaneously delivers a back-up signal of "H" level to the decoder 5 and the impedance lowering circuits 8 and 10 via the back-up signal line 15.

The power cutoff circuit 31 of the input buffer circuit 2 shown in FIG. 2 is thereby conducted to supply the power to the unidirectional buffers 32a and 32b and, at the same time, the power is also supplied to the 3-state unidirectional buffers 33a and 33b through the internal power line 14, allowing the address bus 16, the output enable signal line 17 and the write enable signal line 18 to input signals therethrough.

In the decoder 5 shown in FIG. 4, the power cutoff circuit 40 is conducted to supply the power to the inverters 41a, 41b and the OR circuit 42b and, at the same time, the power is also supplied to the OR circuit 42a through the internal power line 14. Now, when the chip select address signal line 12 branched from the address bus 16 is at an "L" level, the nonvolatile memory chip select signal line 26 as an output line of the OR circuit 42b takes an "H" level regardless of the level of the chip select signal line 19, whereby the nonvolatile memory 4 is brought into a non-select state. At this time, because the output of the inverter 41b becomes an "L" level, the level of the internal chip enable signal line 24 as an output line of the OR circuit 42a is changed depending on the level of the chip select signal line 19. Thus, turning the chip select signal line 19 to an "L" level permits read/write operations of the static RAM 1.

On the other hand, when the chip select address signal line 12 is at an "H" level, the internal chip enable signal line 24 remains at an "H" level to bring the static RAM 1 into a non-select state, while the level of the nonvolatile memory chip select signal line 26 is changed depending on the level of the chip select signal line 19. Thus, turning the chip select signal line 19 to an "L" level permits read/write operations of the nonvolatile memory 4.

In the input/output buffer circuit 3 shown in FIG. 3, the power cutoff circuit 50 is conducted to supply the power to all elements of the bidirectional buffer circuit 9. Under this condition, when the chip select signal line 19 is at an "H" level, an output of the inverter 52a becomes an "L" level to make the NAND circuits 53a and 53b each output an "H" level. Then, the bus control signal lines 57 and 58 each take an "L" level under the action of the inverters 52d and 52e. Consequently, the 3-state non-inverters 51a through 52d are all disabled so that the bidirectional ports A and B are turned off. This state is called a standby mode in which any access to the static RAM 1 and the nonvolatile memory 4 is inhibited. At this time, since the back-up signal line 15 leading from the power control circuit 6 takes an "H" level, the 3-state inverter 59 of the impedance lowering circuit 10 outputs an "L" level and the 3-state non-inverter 51e is disabled.

On the other hand, when the chip select signal line 19 is at an "L" level and the internal output enable signal line 22 is at an "L" level, the bus control signal lines 57 and 58 take an "L" and "H" level, respectively. As a result, the non-inverters 51a and 51d are disabled, but the non-inverters 51b and 51c are enabled to permit data transmission from the port A to the port B, i.e., memory read. Furthermore, when the chip select signal line 19 is at an "L" level and the internal output enable signal line 22 is at an "H" level, the bus control signal lines 57 and 58 take an "H" and "L" level, respectively. As a result, the non-inverters 51a and 51d are enabled, but the non-inverters 51b and 51c are disabled, thereby permitting data transmission from the port B to the port A, i.e., memory write.

Next, when the supply of power from the terminal unit is cut off and the voltage of the external input power line 13 does not reach the predetermined threshold, the power control circuit 6 is brought into a turned-off state and the power is now supplied from the battery 29 to the internal power line 14 via the reverse current blocking diode 27 and the current limiting resistor 28 in FIG. 1. Accordingly, the stored data in the static RAM 1 can be held as it is. At the same time, the back-up signal of "L" level is delivered from the power control circuit 6 to the decoder 5 and the impedance lowing circuits 8 and 10 via the back-up signal line 15.

The power cutoff circuit 31 of the input buffer circuit 2 shown in FIG. 2 is thereby turned to a cutoff state. At this time, input terminals of the 3-state unidirectional buffers 33a and 33b are respectively connected to the external input power line 13 via the pull-up resistors 34a and 34b and, therefore, each take an "L" level. Also, since the power is supplied from the battery 29 to the unidirectional buffers 33a and 33b via the internal power line 14, these buffers 33a and 33b are in an active state and each output an "L" level. Thus, the input bus of the static RAM 1 is lowered in impedance. Under this condition, even if any signal is applied to the ports 35a and 35b, a current will not flow out into the external input power line 13 because of the power cutoff circuit 31 being in a cutoff state.

Also, in the input/output buffer circuit 3 shown in FIG. 3, the power cutoff circuit 50 is turned off to cease the supply of power to the respective elements of the bidirectional buffer circuit 9. Meanwhile, the power is supplied via the internal power line 14 from the battery 29 to the 3-state non-inverter 51e and the 3-state inverter 59 of the impedance lowering circuit 10. At this time, since the back-up signal line 15 is at an "L" level, the gate terminal of the non-inverter 51e takes an "H" level to make same enabled. With an input terminal of the non-inverter 51e being grounded, the port A as an output terminal of the non-inverter 51e takes an "L" level. Thus, the input/output bus of the static RAM 1 is lowered in impedance. Under this condition, even if any signal is applied to the data bus 20, a current will not flow out into the external input power line 13 because of the power cutoff circuit 50 being in a cutoff state.

Further, in the decoder 5 shown in FIG. 4, the power cutoff circuit 40 is turned off to cease the supply of power to the inverters 41a, 41b and the OR circuit 42b. Meanwhile, the power is supplied from the battery 29 to the OR circuit 42a via the internal power line 14. At this time, since the back-up signal line 15 is at an "L" level, the OR circuit 42a comes into a high-impedance state and the internal chip enable signal line 24 as an output line of the OR circuit 42a is pulled up to an "H" level under the action of an pull-up resistor 11 shown in FIG. 1. Consequently, the static RAM 1 is disabled. In addition, the memory 4 is nonvolatile and able to hold the data stored therein even if the level of the nonvolatile memory chip select signal line 26 is indefinite under no supply of power.

As explained above, when the voltage of the external input power line 13 cannot reach the predetermined threshold, all the input/output terminals of the static RAM 1 and the nonvolatile memory 4 are turned to an "L" level except for that the internal chip enable signal line 24 takes an "H" level. In this condition, even if any signal is applied to the address bus 16, the output enable signal line 17, the write enable signal line 18, the chip select signal line 19 and the data bus 20, an abnormal current will not flow out into the external input power line 13 because the impedance of the external input power line 13 is very large, as viewed from those signal lines or bus, under the action of the power cutoff circuits 31, 40 and 50. Furthermore, even if those signal lines and bus 16 through 20 are here connected to any other equipment, the input/output terminals of the static RAM 1 and the nonvolatile memory 4 will undergo no influence.

Under that condition, it is just required to supply a current from the battery 29 to only the necessary minimum number of IC's, i.e., the static RAM 1, the impedance lowering circuit 8 of the input buffer circuit 2, the impedance lowering circuit 10 of the input/output buffer circuit 2, and the decoder 5, making it possible to suppress the consumption current from the battery 29 to a very small value. As a result, the life time of the battery 29 is prolonged.

Also, all the input/output terminals of the static RAM 1 and the nonvolatile memory 4 approach near 0 V except for that the internal chip enable signal 24 takes the level of the internal power line 14. Therefore, the input/output terminals of the static RAM 1 and the nonvolatile memory 4 will not be fluctuated in their level with extraneous noise and ESD (electrostatic discharge). As a result, extremely high resistance against noise can be achieved.

Moreover, when the storage of this embodiment is carried with persons, i.e., when no power is supplied to the external input power line 13, a current will not be consumed by the internal power line 14 upon level fluctuations of the respective signal lines and bus 16 through 20 as mentioned above, thereby eliminating the need to pull up or down those signal lines and bus 16 through 20 by the use of resistors. Thus, makes it possible to reduce the number of parts and to greatly cut down the assembly cost of circuits. As a result, the portable semiconductor storage with high reliability can be achieved at the low production cost.

Figure 5:
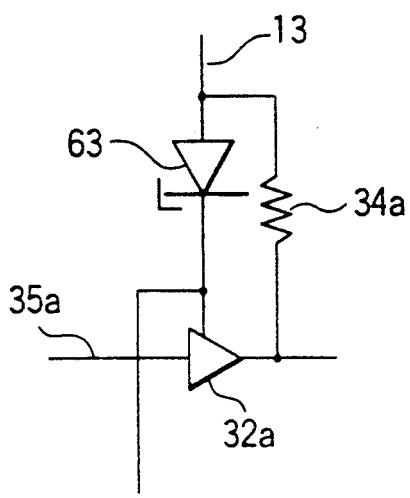
FIG. 5 is a circuit diagram showing a modification of a power cutoff circuit used in the input buffer circuit.

Although the power cutoff circuits 31, 40 and 50 can each be an analog switch, a zener diode 63 may instead be used as shown in FIG. 5. When the power is supplied to the external input power line 13, the zener diode 63 is put in the forward direction so that the unidirectional buffer 32a is supplied with, as source power, a value resulted by subtracting the forward drop voltage across the zener diode 63 from the potential of the external input power line 13. On the other hand, when no power is supplied to the external input power line 13, the zener diode 63 is now put in the backward direction and exhibits very large impedance. Thus, the zener diode 63 is brought into a cutoff state. Note that FIG. 5 shows the circuit configuration of only one port for brevity of explanation. In this modification, the pull-up resistors 34a and 34b shown in FIG. 2 can be dispensed with.

In the event the high voltage is applied to the port 35a due to extraneous noise or the like, an abnormal current is allowed to flow out into the external input power line 13 via the zener diode 63. Therefore, the zener diode 63 also acts as a protection circuit. It is generally desirable that the zener potential of the zener diode 63 has a value exceeding the rated absolute maximum one of a circuit IC which contains the zener diode 63. Assuming the rated maximum voltage of the IC be 7 V, for example, the zener potential should be over 7 V.

Figure 6:
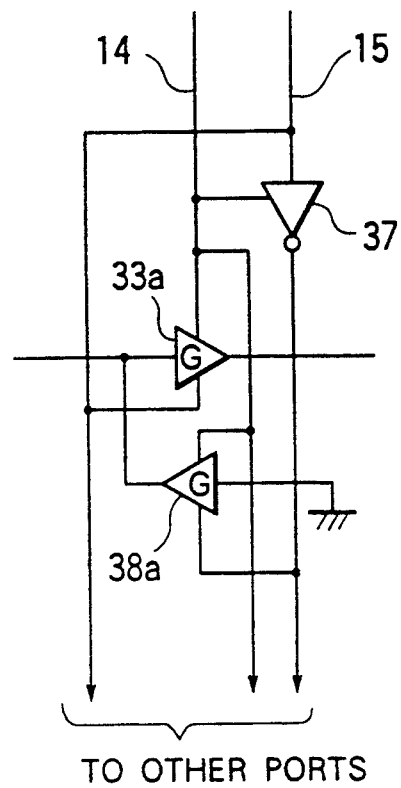
FIG. 6 is a circuit diagram showing a modification of an impedance lowering circuit used in the input buffer circuit.

FIG. 6 shows a modification of the impedance lowering circuit 8 of the input buffer circuit 2. An "L"-level output circuit 38a is connected to the input terminal of the 3-state unidirectional buffer 33a, and the back-up signal line 15 is connected to a gate terminal of the "L"-level output circuit 38a via an inverter 37. Supplied to the "L"-level output circuit 38a and the inverter 37 is the power from the internal power line 14. When the voltage of the external input power line 13 cannot reach the predetermined threshold, the back-up signal line 15 takes an "L" level to make the inverter 37 output an "H" level, thereby bringing the "L"-level output circuit 38a into an enabled state. Since the "L"-level output circuit 38a is grounded at its input terminal, it issues an "L" level so that an output of the buffer 33a becomes an "L" level. Thus, the input bus of the static RAM 1 is lowered in impedance.

Figure 7:
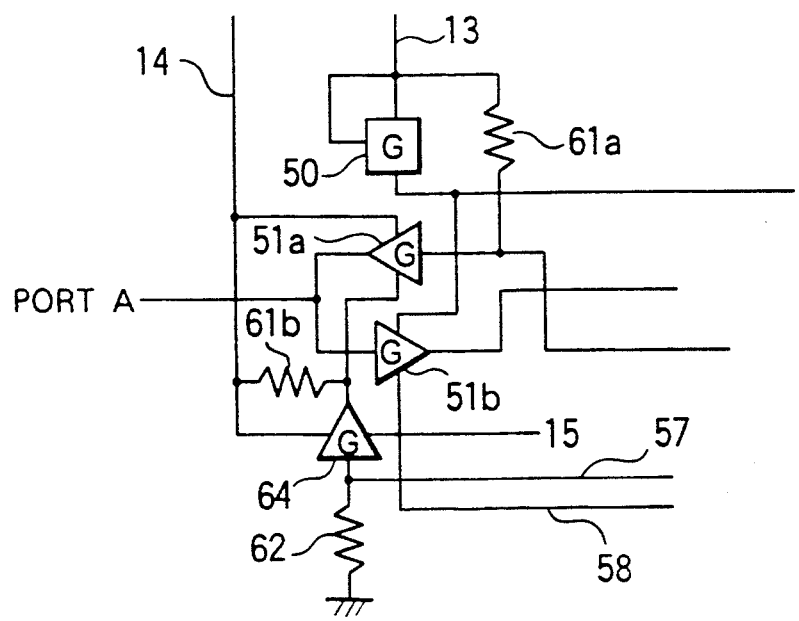
FIG. 7 is a circuit diagram showing a modification of an impedance lowering circuit used in the input/output buffer circuit.

FIG. 7 shows a modification of the impedance lowering circuit 10 of the input/output buffer circuit 3. A 3-state non-inverter 64 is inserted between the bus control signal line 57 and the 3-state non-inverter 51a, and the back-up signal line 15 is connected to a gate terminal of the non-inverter 64. Supplied to both the non-inverters 51a and 64 is the power from the internal power line 14. Furthermore, pull-up resistors 61a and 61b are respectively connected between the external input power line 13 and the input terminal of the non-inverter 51a and between the internal power line 14 and the gate terminal of the non-inverter 51a. An input terminal of the non-inverter 64 is grounded via a pull-down resistor 62.

In such an impedance lowering circuit, when the voltage of the external input power line 13 does not reach the predetermined threshold, the input terminal of the non-inverter 51a is pulled down by the presence of the resistor 61a. On the other hand, with the back-up signal line 15 taking an "L" level, the non-inverter 64 comes into a high-impedance state. But, since an output terminal of the non-inverter 64 is pulled up by the pull-up resistor 61b, the non-inverter 51a is enabled to output an "L" level to the port A. This circuit configuration can dispense with the non-inverter 51e and the inverter 59 in FIG. 3 and, as a result, the number of IC's required for lowering the impedance is reduced by one.

An EEPROM, flash EEPROM, mask ROM, one-time PROM or the like may be used as the nonvolatile memory 4. It is also possible to arrange the decoder 5 in such a manner as able to decode a multiplicity of memories for installing the statics RAM in the plural number.

Figure 8:
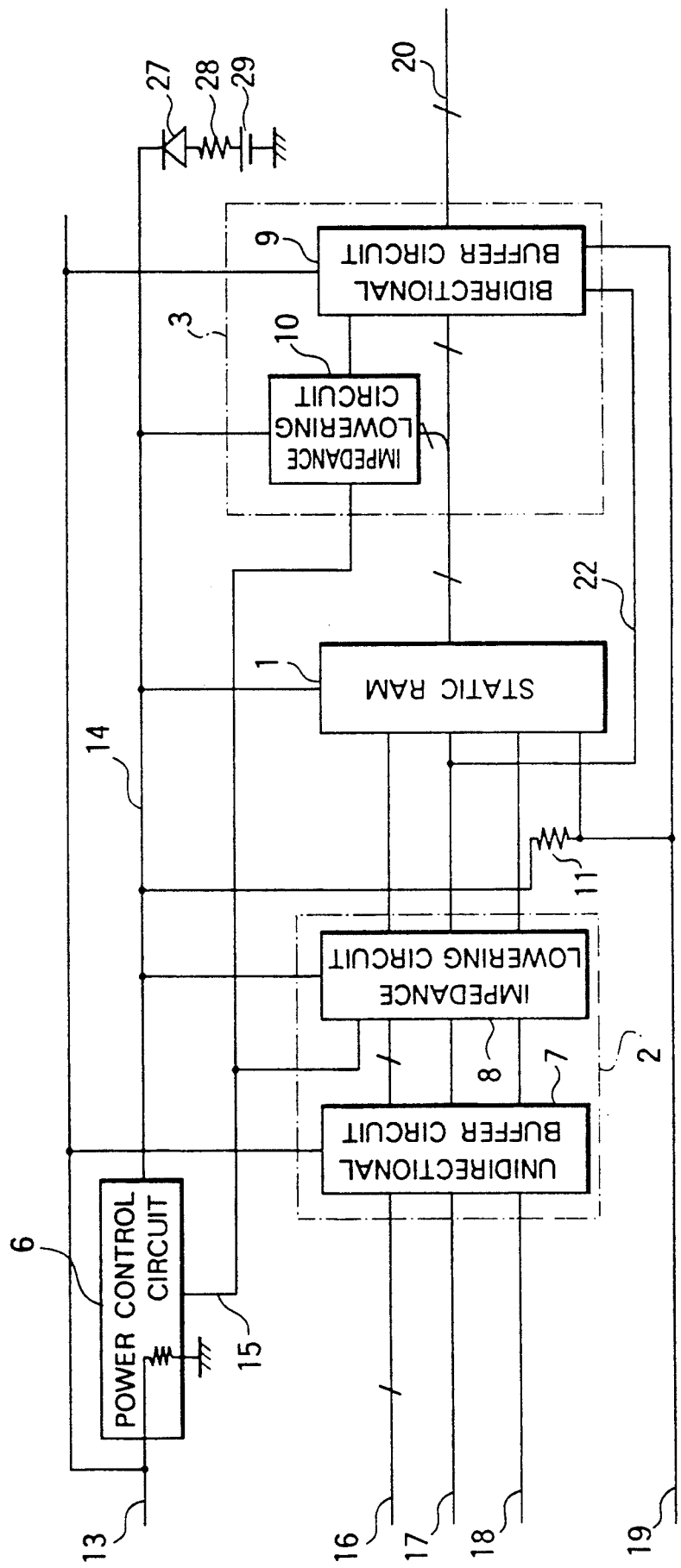
FIG. 8 is a block diagram showing a portable semiconductor storage according to another embodiment.
Figure 9:
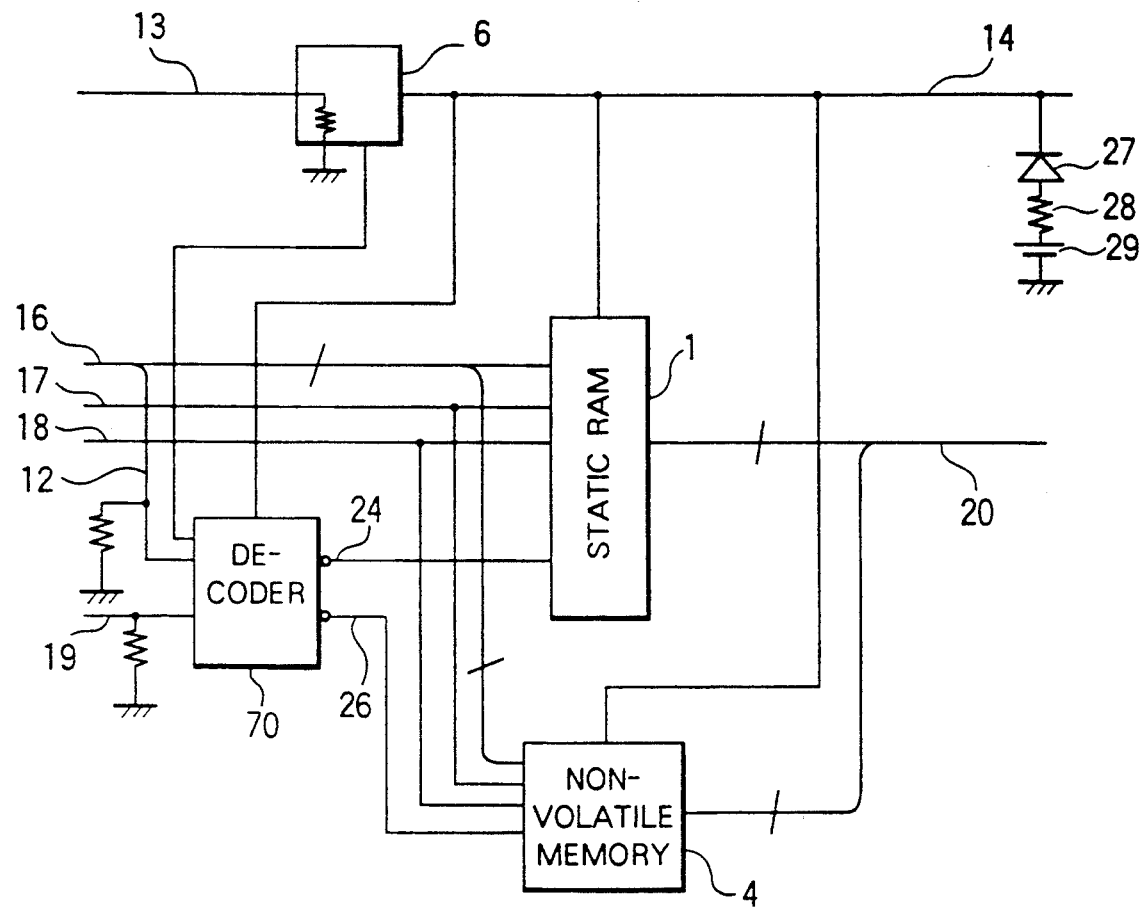
FIG. 9 is a block diagram showing a conventional portable semiconductor storage.
Figure 10:
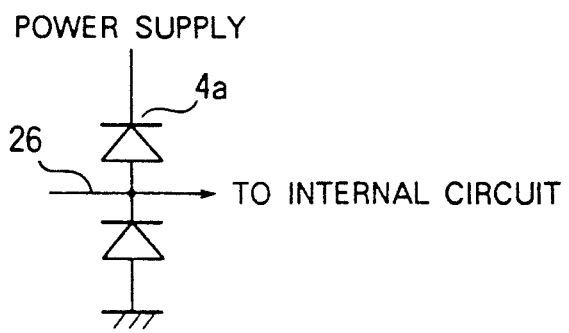
FIG. 10 is a circuit diagram showing an input section of a nonvolatile memory in the storage of FIG. 9.

Moreover, as shown in FIG. 8, the storage may include no nonvolatile memory, but the static RAM 1 alone. In this case, the decoder 5 in FIG. 1 can be omitted and the chip select signal line 19 is directly connected to the static RAM 1. Alternatively, the storage may include not the static RAM 1, but the nonvolatile memory 4 alone. In this case, the built-in battery 29 can be also omitted.

What is claimed is:

1. An input buffer circuit for a semiconductor memory comprising:
   an input bus,
   at least one first unidirectional buffer connected to said input bus,
   a first power supply line for supplying power to said first unidirectional buffer from a first power supply,
   a power cutoff circuit connected in series and between said first unidirectional buffer and said first power supply line, said power cutoff circuit connecting said first power supply line to said first unidirectional buffer when a voltage exceeding a predetermined voltage threshold is applied to said first power supply line by said first power supply and disconnecting said first power supply line from said first unidirectional buffer when a voltage not exceeding the predetermined threshold voltage is applied to said first power supply line,
   a second power supply line for supplying power from a second power supply,
   an impedance lowering circuit connected in series to the at least one first unidirectional buffer and said first and second power supply lines for lowering impedance of said input bus when the voltage applied to said first power supply line does not exceed the predetermined threshold voltage, said impedance lowering circuit including a second unidirectional buffer connected between said first unidirectional buffer and said input bus, and "L" level output means for outputting a signal of "L" level to an input terminal of said second unidirectional buffer when the predetermined threshold voltage is not applied to said power supply line, and
   power control means for disconnecting said first power supply line from said second power supply line when the voltage applied to said first power supply line is below the predetermined threshold voltage, said second power supply line being connected to said first power supply line when the voltage applied to said first power supply line exceeds the predetermined threshold voltage.

2. An input buffer circuit according to claim 1, wherein said "L" level output means comprises a resistor connected between said first power supply line and the input terminal of said second unidirectional buffer.

3. An input buffer circuit according to claim 1, wherein said "L" level output means comprises a non-inverter having a grounded input and an output connected to the input terminal of said second unidirectional buffer, said non-inverter being enabled only when the predetermined threshold voltage is not applied to said first power supply line.

4. An input buffer circuit according to claim 1, wherein said power cutoff circuit includes an analog switch.

5. An input buffer circuit according to claim 1, wherein said power cutoff circuit includes a zener diode.

6. An input buffer circuit for a semiconductor memory comprising:

an input/output bus, at least one bidirectional buffer connected to said input/output bus, a first power supply line for supplying power to said bidirectional buffer from a first power supply, a power cutoff circuit connected in series between said bidirectional buffer and said first power supply line, said power cutoff circuit connecting said first power supply line to said bidirectional buffer when a voltage exceeding a predetermined threshold voltage is applied to said first power supply line by said first power supply and disconnecting said first power supply line from said bidirectional buffer when a voltage not exceeding the predetermined threshold voltage is applied to said first power supply line, an impedance lowering circuit connected to the at least one bidirectional buffer and said input/output bus for lowering impedance of said input/output bus when the voltage applied to said first and second power supply line does not exceed the predetermined threshold voltage, said impedance lowering circuit including "L" level output means for outputting a signal of "L" level to said input/output bus from said bidirectional buffer when the predetermined threshold voltage is not applied by said first power supply line.

a second power supply line for supplying power from a second power supply to said impedance lowering circuit, and power control means disconnecting said first power supply line from said second power supply line when the voltage applied to said first power supply line is below the predetermined threshold voltage, said second power supply line being connected to said first power supply line when the voltage applied to said first power supply line exceeds the predetermined voltage threshold.

7. An input/output buffer circuit according to claim 6, wherein said impedance lowering circuit comprises a non-inverter having a grounded input and an output connected to the input/output bus, said non-inverter being enabled only when the predetermined threshold voltage is not applied by said first power supply line.

8. An input/output buffer circuit according to claim 6, wherein said power cutoff circuit includes an analog switch.

9. An input/output buffer circuit according to claim 6, wherein said power cutoff circuit includes a zener diode.

10. A portable semiconductor memory device comprising:

a semiconductor memory including an input bus having an impedance and an input/output bus having an impedance, an internal power line connected to said semiconductor memory, an external power input line, a power control circuit for connecting said external power input line to said internal power line only when a voltage on said external power input line exceeds a predetermined threshold, an input buffer circuit having an internal buffer coupled to said input bus of said semiconductor memory and connected to said external power input line, an input/output buffer circuit having an internal buffer coupled to said input/output bus of said semiconductor memory and connected to the external power input line, power cutoff means for connecting said internal buffer of said input buffer circuit and said internal buffer of said input/output buffer circuit to said external power input line when the voltage on said external power input line exceeds the predetermined threshold and for disconnecting said internal buffer of said input buffer circuit and said internal buffer of said input/output buffer circuit from said external power input line when the voltage of said external power input line does not exceed the predetermined threshold, and impedance lowering means connected to said input bus and said input/output bus and including a first input impedance lowering circuit for lowering the impedance of said input bus of said semiconductor memory, said first impedance lowering circuit including a unidirectional buffer having an input connected to an output of said input buffer circuit and an output connected to said input bus of said semiconductor memory, and first "L" level output means for outputting a signal of "L" level to the input of said unidirectional buffer only when the voltage on said external power input line does not exceed the predetermined threshold, and a second impedance lowering circuit for lowering the impedance of said input/output bus of said semiconductor memory when the voltage on said external power input line does not exceed the predetermined threshold.

11. A memory device according to claim 10, wherein said first "L" level output means comprises a resistor connected between said external input power line and the input of said unidirectional buffer.

12. A memory device according to claim 10, wherein said first "L" level output means comprises a non-inverter having a grounded input and an output connected to the input of said unidirectional buffer, and said first "L" level output means being enabled only when the voltage on said external power input line is below the predetermined threshold.

13. A memory device according to claim 12, wherein said non-inverter is enabled in response to a signal from said power control circuit.

14. A memory device according to claim 10, wherein said second impedance lowering circuit comprises a non-inverter having a grounded input and an output connected to said input/output bus of said semiconductor memory, said non-inverter being enabled only when the voltage on the predetermined external power input line is below said threshold.

15. A memory device according to claim 10, wherein said second impedance lowering circuit includes second "L" level output means for outputting a signal of "L" level from said input/output buffer circuit to said input/output bus of said semiconductor memory only when the voltage on said external input power line is below the predetermined threshold.

16. A memory device according to claim 10, wherein said power cutoff means includes an analog switch.

17. A memory device according to claim 10, wherein said power cutoff means includes a zener diode.

18. A memory device according to claim 10, further comprising a built-in battery connected to said internal power line, and said semiconductor memory comprising one nonvolatile memory.

19. A memory device according to claim 10, wherein said semiconductor memory comprises one static RAM.

20. A memory device according to claim 10, wherein said semiconductor memory includes a plurality of memory chips.

21. A memory device according to claim 20, further comprising a decoder for selecting one of said plurality of memory chips in response to an address signal.

22. A memory device according to claim 21 wherein said decoder is connected to said external power input line and includes an input circuit connected to an address bus and a power cutoff circuit for connecting said input circuit to said external input power line when the voltage on said external input power line exceeds the predetermined threshold and for disconnecting said input circuit from said external input power line when the voltage on said external input power line is below the predetermined threshold.

23. A memory device according to claim 20 comprising a built-in battery connected to said internal power line, said plurality of memory chips including at least one static RAM connected to said internal power line and at least one nonvolatile memory connected to said external power line.

* * * * *